(12) United States Patent
El-Kareh (10) Patent No.: US 8,114,753 B2
(45) Date of Patent: Feb. 14, 2012

(54) BURIED DECOUPLING CAPACITORS, DEVICES AND SYSTEMS INCLUDING SAME, AND METHODS OF FABRICATION

(75) Inventor: Badih El-Kareh, Cedar Park, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/975,761

(22) Filed: Dec. 22, 2010

(65) Prior Publication Data

US 2011/0092045 A1 Apr. 21, 2011

Related U.S. Application Data

(62) Division of application No. 11/510,945, filed on Aug. 28, 2006, now Pat. No. 7,880,267.

(51) Int. Cl.
*H01L 21/20* (2006.01)

(52) U.S. Cl. ........................ 438/394; 438/455

(58) Field of Classification Search .............. 438/493, 438/494, 393, 394, 455
See application file for complete search history.

(56) References Cited

U.S. PATENT DOCUMENTS

| | | | |
|---|---|---|---|
| 4,333,808 A | 6/1982 | Bhattacharyya et al. | |
| 5,587,870 A | 12/1996 | Anderson et al. | |
| 5,691,556 A | 11/1997 | Saito et al. | |
| 5,939,755 A | 8/1999 | Takeuchi et al. | |
| 6,057,188 A | 5/2000 | El-Kareh et al. | |
| 6,064,108 A | 5/2000 | Martinez | |
| 6,177,716 B1 | 1/2001 | Clark | |
| 6,188,122 B1 | 2/2001 | Davari et al. | |
| 6,294,834 B1 | 9/2001 | Yeh et al. | |
| 6,396,098 B2 | 5/2002 | Ishige | |
| 6,407,442 B2 | 6/2002 | Inoue et al. | |
| 6,421,224 B1 | 7/2002 | Lin et al. | |
| 6,538,282 B1 | 3/2003 | Kanamori | |
| 6,538,283 B1 | 3/2003 | Chittipeddi | |
| 6,700,771 B2 | 3/2004 | Bhattacharyya | |
| 6,815,771 B2 | 11/2004 | Kimura | |
| 6,853,052 B2 | 2/2005 | Ishikawa | |
| 6,936,881 B2 | 8/2005 | Yeo et al. | |
| 6,940,705 B2 | 9/2005 | Yeo et al. | |
| 7,037,772 B2 | 5/2006 | Yeo et al. | |
| 7,105,910 B2 | 9/2006 | Ishio et al. | |
| 7,160,786 B2 | 1/2007 | Kimura | |
| 7,208,355 B2 | 4/2007 | Ishikawa | |
| 7,354,843 B2 | 4/2008 | Yeo et al. | |
| 7,880,267 B2 | 2/2011 | El-Kareh | |
| 2004/0120205 A1* | 6/2004 | Stubbs et al. | 365/226 |

(Continued)

OTHER PUBLICATIONS

Black, C T, et al., "High-capacity, self-assembled metal-oxide-semiconductor decoupling capacitors", IEEE Transactions Electron Device Letters, 25(9), (2004), 622-624.

(Continued)

*Primary Examiner* — Bradley K Smith

(74) *Attorney, Agent, or Firm* — Schwegman, Lundberg, & Woessner, P.A.

(57) ABSTRACT

A buried decoupling capacitor apparatus and method are provided. According to various embodiments, a buried decoupling capacitor apparatus includes a semiconductor-on-insulator substrate having a buried insulator region and top semiconductor region on the buried insulator region. The apparatus embodiment also includes a first capacitor plate having a doped region in the top semiconductor region in the semiconductor-on-insulator substrate. The apparatus embodiment further includes a dielectric material on the first capacitor plate, and a second capacitor plate on the dielectric material. According to various embodiments, the first capacitor plate, the dielectric material and the second capacitor plate form a decoupling capacitor for use in an integrated circuit.

21 Claims, 9 Drawing Sheets

U.S. PATENT DOCUMENTS

| | | | |
|---|---|---|---|
| 2004/0197967 A1* | 10/2004 | Chen | 438/154 |
| 2004/0264100 A1 | 12/2004 | Balster et al. | |
| 2006/0011224 A1* | 1/2006 | Chen | 134/137 |
| 2008/0048231 A1 | 2/2008 | El-Kareh et al. | |
| 2009/0004809 A1* | 1/2009 | Chinthakindi et al. | 438/393 |

OTHER PUBLICATIONS

Hu, H, et al., "High performance ALD HfO/sub 2/-Al/sub 2/O/sub 3/ laminate MIM capacitors for RF and mixed signal IC applications", IEEE International Electron Devices Meeting, 2003. IEDM '03 Technical Digest., (2003), 379-382.

Ishikawa, Tsuyoshi, "High-Capacitance Cu/Ta2O5/Cu MIM Structure for SoC Applications Featuring a Single-Mask Add-on Process", 2002 International Electron Devices Meeting, (2002), 940-942.

Kim, Sun-Jung, et al., "Metal-insulator-metal RF bypass capacitor using niobium oxide (Nb/sub 2/O/sub 5/) with HfO/sub 2//Al/sub 2/O/sub 3/ barriers", IEEE Elecron Device Letters, 26(9), (2005), 625-27.

* cited by examiner

BURIED DECOUPLING CAPACITORS, DEVICES AND SYSTEMS INCLUDING SAME, AND METHODS OF FABRICATION

PRIORITY APPLICATION

This application is a divisional of U.S application Ser. No. 11/510,945, filed Aug. 28, 2006 now U.S. Pat. No. 7,880,267, which is incorporated herein by reference in its entirety.

TECHNICAL FIELD

This disclosure relates to electrical circuits, and more particularly, to embodiments of buried decoupling capacitors, circuits, devices and systems including such capacitors, and methods of fabrication.

BACKGROUND

Goals for integrated circuit design include scaling the design to achieve smaller feature sizes, and using progressively faster clock frequencies. Problems encountered in achieving these goals include increasing voltage droop and inductive noise of active switching nodes, and further include increasing power supply oscillations and the resulting noise that is generated and transmitted across the chip.

These problems are addressed by incorporating on-chip decoupling capacitors into integrated circuit design. Many digital circuits or modules use a decoupling capacitor to reduce electrical noise. On-chip decoupling capacitors provide a uniform power supply voltage to fast switching nodes and offset the voltage droops caused by resistive and inductive losses in the integrated circuit load. Capacitors currently used for that purpose use a large amount of chip area or add topography by stacking capacitor layers on top of each other. This additional area used for decoupling can negatively impact chip cost and circuit operational performance. Improved decoupling capacitors and methods are needed.

DETAILED DESCRIPTION

The following detailed description refers to the accompanying drawings which show, by way of illustration, specific embodiments in which the present invention may be practiced. The various embodiments are not necessarily mutually exclusive, as aspects of one embodiment can be combined with aspects of another embodiment. These embodiments are described in sufficient detail to enable those skilled in the art to practice the invention. Other embodiments may be utilized and structural, logical, and electrical changes may be made without departing from the scope of the present invention.

References to "an", "one", or "various" embodiments in this disclosure are not necessarily to the same embodiment, and such references contemplate more than one embodiment.

Disclosed herein are a buried decoupling capacitor apparatus and methods. The disclosed apparatus and methods provide for decoupling capacitance without using excessive chip area or topography, increasing performance and decreasing overall production costs. Also disclosed are circuits, devices and systems including embodiments of buried decoupling capacitors.

Figure 1:
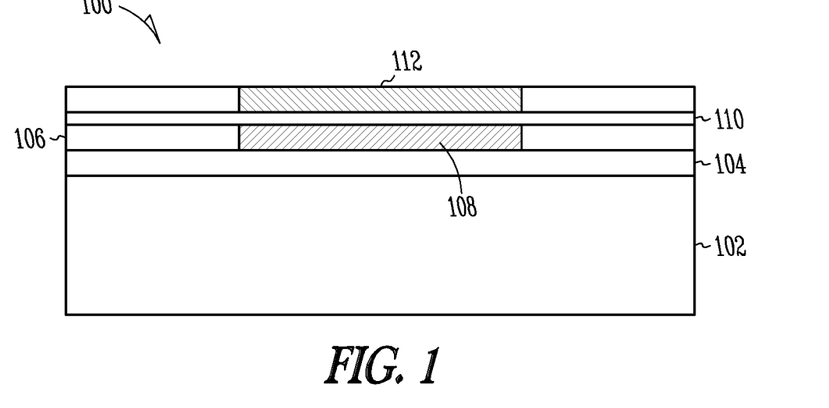
FIG. 1 illustrates a side view of a buried decoupling capacitor apparatus, according to an embodiment.

FIG. 1 illustrates a side view of a buried decoupling capacitor apparatus, according to an embodiment. The apparatus 100 includes a semiconductor-on-insulator substrate 102 having a buried insulator region 104 and top semiconductor region 106 on the buried insulator region. The embodiment also includes a first capacitor plate 108 having a doped region in the top semiconductor region in the semiconductor-on-insulator substrate. The embodiment further includes a dielectric material 110 on the first capacitor plate, and a second capacitor plate 112 on the dielectric material. The first capacitor plate, the dielectric material and the second capacitor plate form a decoupling capacitor for use in an integrated circuit, such as a memory circuit.

The buried insulator region includes a buried oxide (BOX) layer. Other types of insulators may be used without departing from the scope of this disclosure, such as a buried nitride layer. The top semiconductor region includes intrinsic silicon in an embodiment. Other types of semiconductor materials may be used without departing from the scope of this disclosure, such as germanium. The second capacitor plate may include a silicon film, in one embodiment. In another embodiment, the second capacitor plate includes a metal. Other types of materials may be used for the second capacitor plate without departing from the scope of this disclosure, such as a germanium film. The dielectric material may include silicon dioxide in an embodiment. Other types of dielectric materials, including high-k materials may be used in various embodiments. High-k materials are high dielectric constant materials, defined herein as materials with a higher dielectric constant than silicon dioxide.

Another embodiment of a buried decoupling capacitor apparatus includes a silicon-on-insulator substrate including a buried insulator region and top silicon region on the buried insulator region. The embodiment also includes a first capacitor plate including a doped region in the top silicon region in the silicon-on-insulator substrate. The embodiment further includes a dielectric material on the first capacitor plate, and a second capacitor plate on the dielectric material. According to an embodiment, the buried insulator region includes a buried oxide (BOX) layer. The second capacitor plate includes a silicon film, in an embodiment. In one embodiment, the second capacitor plate may include a source/drain region within the silicon film. According to various embodiments, the dielectric material includes silicon dioxide, a high-k material, or other suitable dielectric material.

Figure 2A:
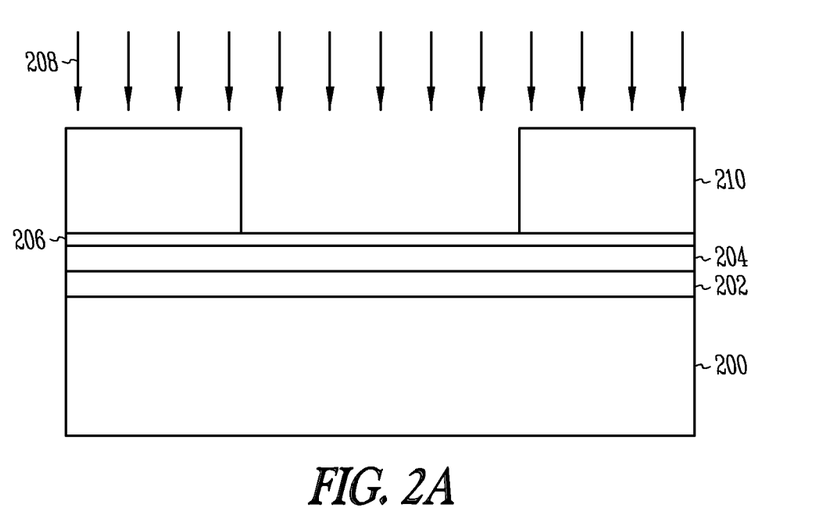
FIGS. 2A-2H illustrate process steps for fabricating a buried decoupling capacitor apparatus, according to an embodiment.
Figure 2B:
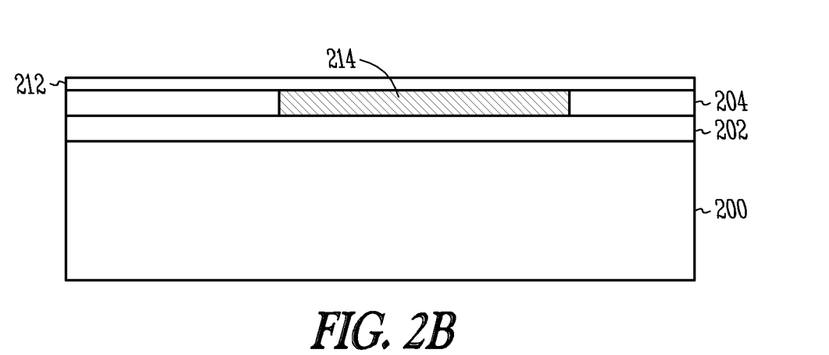

FIGS. 2A-2H illustrate process steps for fabricating a buried decoupling capacitor apparatus, according to an embodiment. In FIG. 2A, a support wafer 200 is shown with a semiconductor-on-insulator substrate including a buried insulator layer 202 of conventional thickness and a top semiconductor region 204 such as thin, intrinsic silicon. A sacrificial layer 206, such as oxide, is deposited or grown, and a buried plate 214 (shown in FIG. 2B) is patterned with resist 210 and the buried, or bottom, capacitor plate 214 is implanted into the top semiconductor region. The implant 208 may include boron, arsenic or phosphorous. In FIG. 2B, the sacrificial oxide has been removed and a suitable dielectric 212 is grown or deposited over the buried plate 214. The dielectric 212 may include silicon dioxide or a high-k dielectric compatible with a semiconductor-on-insulator process.

Figure 2C:
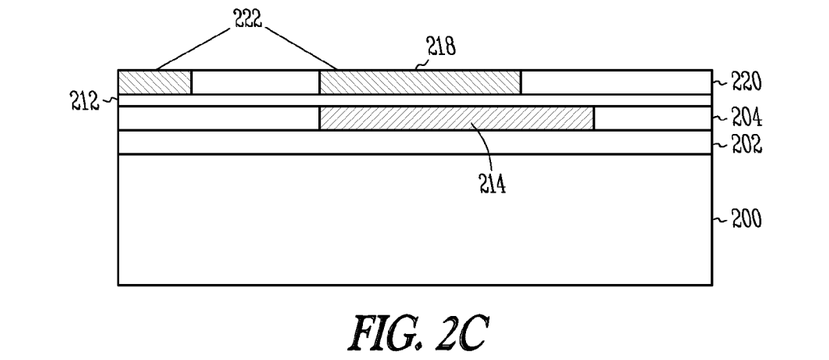
Figure 2D:
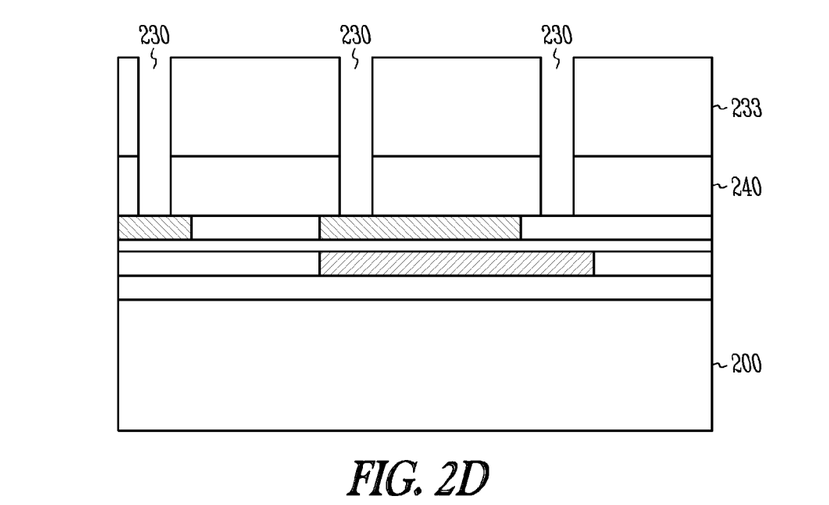
Figure 2E:
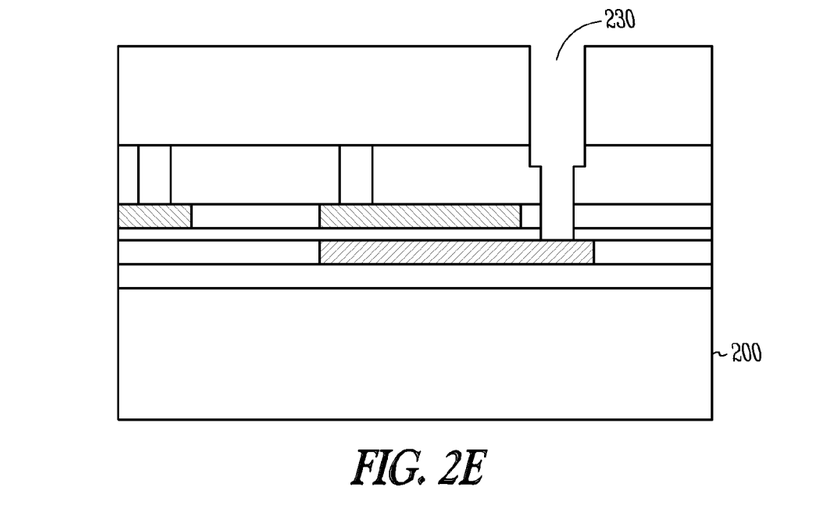
Figure 2F:
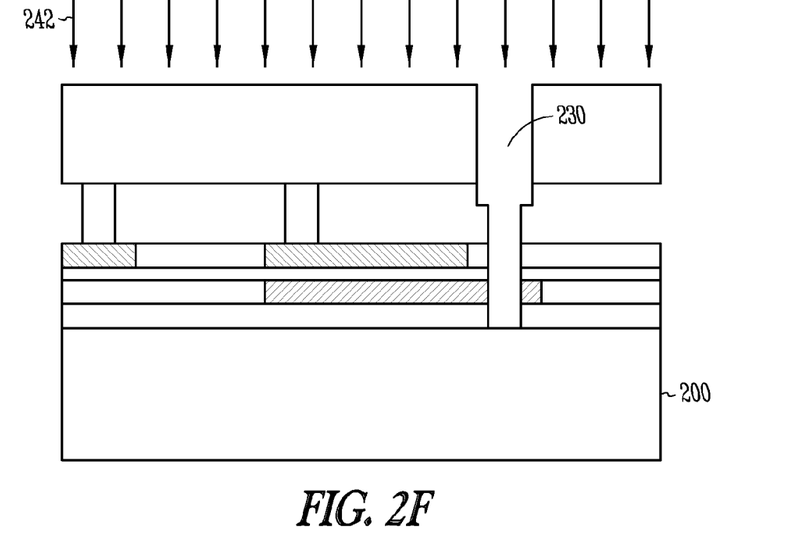
Figure 2G:
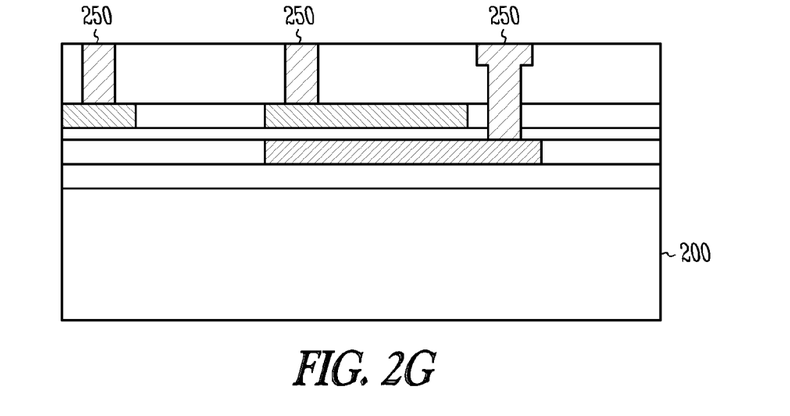
Figure 2H:
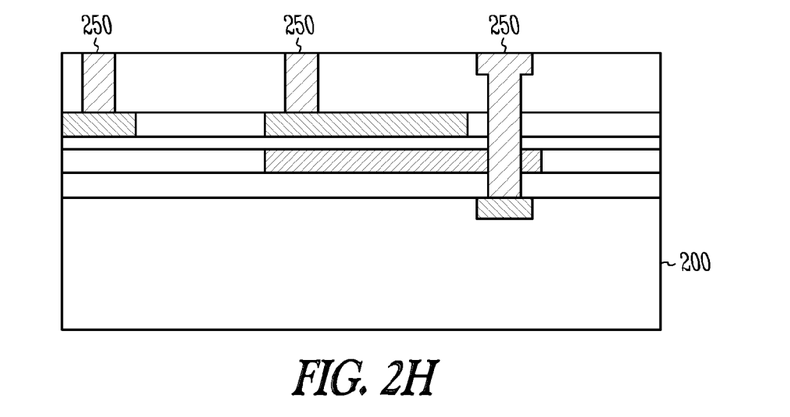

In FIG. 2C, a second semiconductor region 220 is bonded onto the capacitor dielectric. The second region 220 may be bonded using a technique such as a bond-cut or "smart-cut" process, in which two surfaces are bonded and one of them has a portion broken or cut off after bonding. The top capacitor plate 218 resides within this second region 220, and may include source/drain regions 222 of a metal-oxide-semiconductor field effect transistor (MOSFET). The top plate 218 may be patterned at the same time as the source/drain regions. In FIG. 2D, a first inter-level dielectric 240 is deposited and all contacts, including a contact to the bottom plate and support wafer are patterned (using resist 233) and etched. Contact openings 230 are formed by etching. The mask dedicated to contact the support wafer may be used to either etch the contact opening 230 down to the bottom plate only (as shown in FIG. 2E) or down to both the bottom plate (contacted on the sides) and to the support wafer, typically at ground. In the latter case, an implant 242 is performed to form an ohmic contact to the support wafer. Contact fill and back end of line (BEOL) processing are subsequently completed. According to an embodiment, BEOL processing includes removing residue from metal lines and contact/via structures, including the use of wet chemical cleaning processes. Contacts 250 are shown in FIG. 2G (contact down to bottom plate only) and in FIG. 2H (contact down to both bottom plate and support wafer). Methods for making buried decoupling capacitors are further discussed below.

Figure 3:
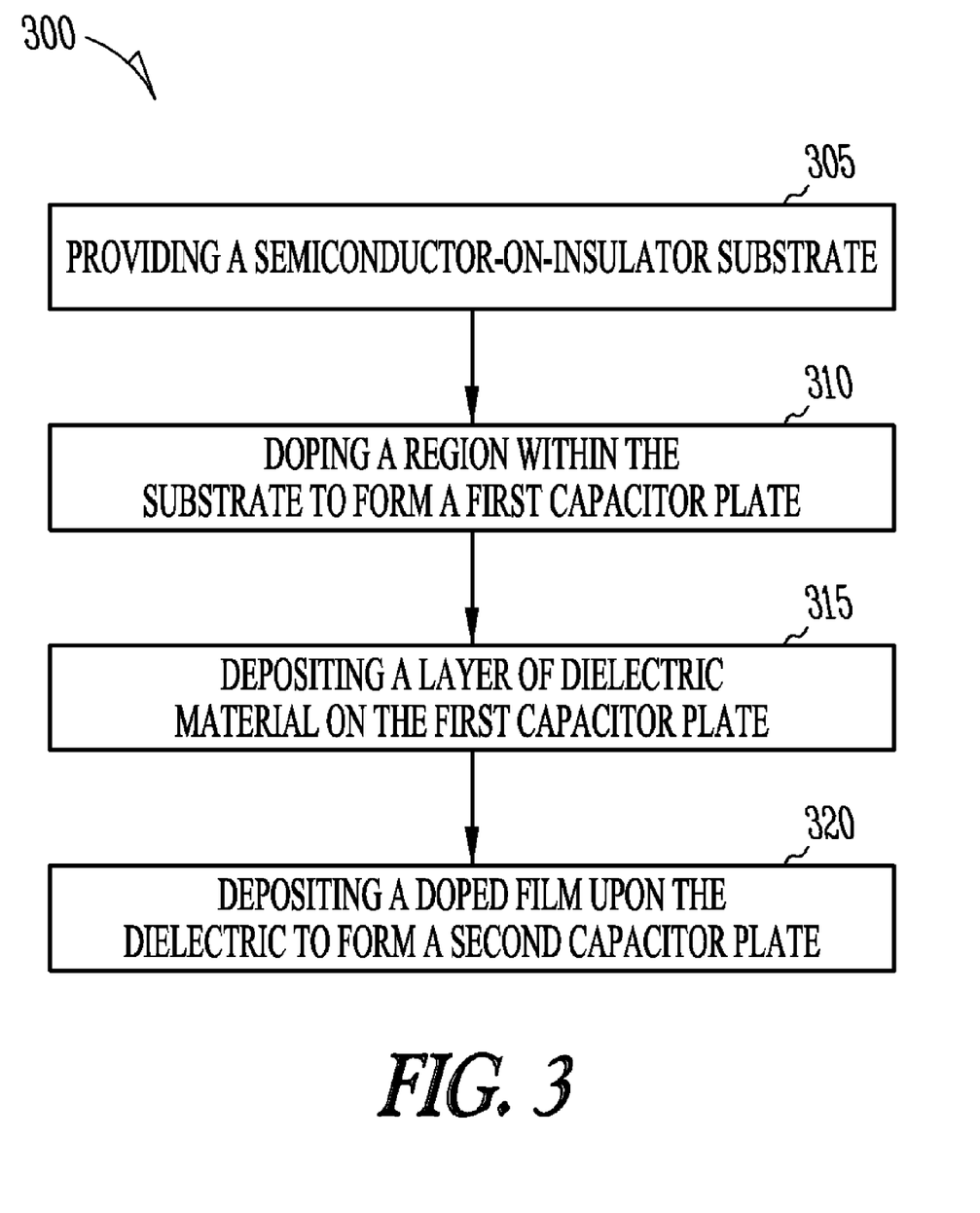
FIG. 3 illustrates a flow diagram of a method for making a buried decoupling capacitor apparatus, according to an embodiment.

FIG. 3 illustrates a flow diagram of a method 300 for making a buried decoupling capacitor apparatus, according to an embodiment. The depicted method embodiment includes providing a semiconductor-on-insulator substrate, at 305, and doping a region within the substrate to form a first capacitor plate, at 310. The method embodiment further includes depositing a layer of dielectric material on the first capacitor plate, at 315, and depositing a doped film upon the dielectric to form a second capacitor plate, at 320.

According to an embodiment, doping a region within the substrate includes doping a region within a semiconductor portion of the substrate. The method further includes depositing an inter-level dielectric upon the second plate, according to various embodiments. The method may also include providing a pattern for contacts upon the inter-level dielectric. Various method embodiments may include etching contact vias using the pattern. The method embodiment may also include depositing conductive material into the vias to form ohmic contacts. In an embodiment, the method further includes depositing a contact fill material around the contacts. Back end of line (BEOL) processing is performed on the contacts, according to various embodiments.

Another embodiment of a method for making a buried decoupling capacitor apparatus includes providing a silicon-on-insulator substrate including a buried insulator region and top silicon region on the buried insulator region, and doping a region within the top silicon region to form a first capacitor plate. The method embodiment further includes depositing a layer of dielectric material on the first capacitor plate, and depositing a doped film upon the dielectric to form a second capacitor plate.

Depositing a layer of dielectric material includes depositing a high-k dielectric material, according to various embodiments. In various embodiments, depositing a doped film includes patterning source/drain regions for a transistor. Patterning source/drain regions for a transistor includes patterning regions for an NMOS (n-type MOSFET) transistor or PMOS (p-type MOSFET) transistor, according to various embodiments. Other types of transistors, including types of metal-oxide-semiconductor field effect transistors (MOSFET) and bipolar junction transistor (BJT) may be used without departing from the scope of this disclosure.

According to an embodiment, forming the first capacitor plate, the dielectric material and the second capacitor plate include forming a decoupling capacitor. Forming the decoupling capacitor includes forming the decoupling capacitor as part of an integrated circuit, such as a memory circuit in various embodiments.

Figure 4:
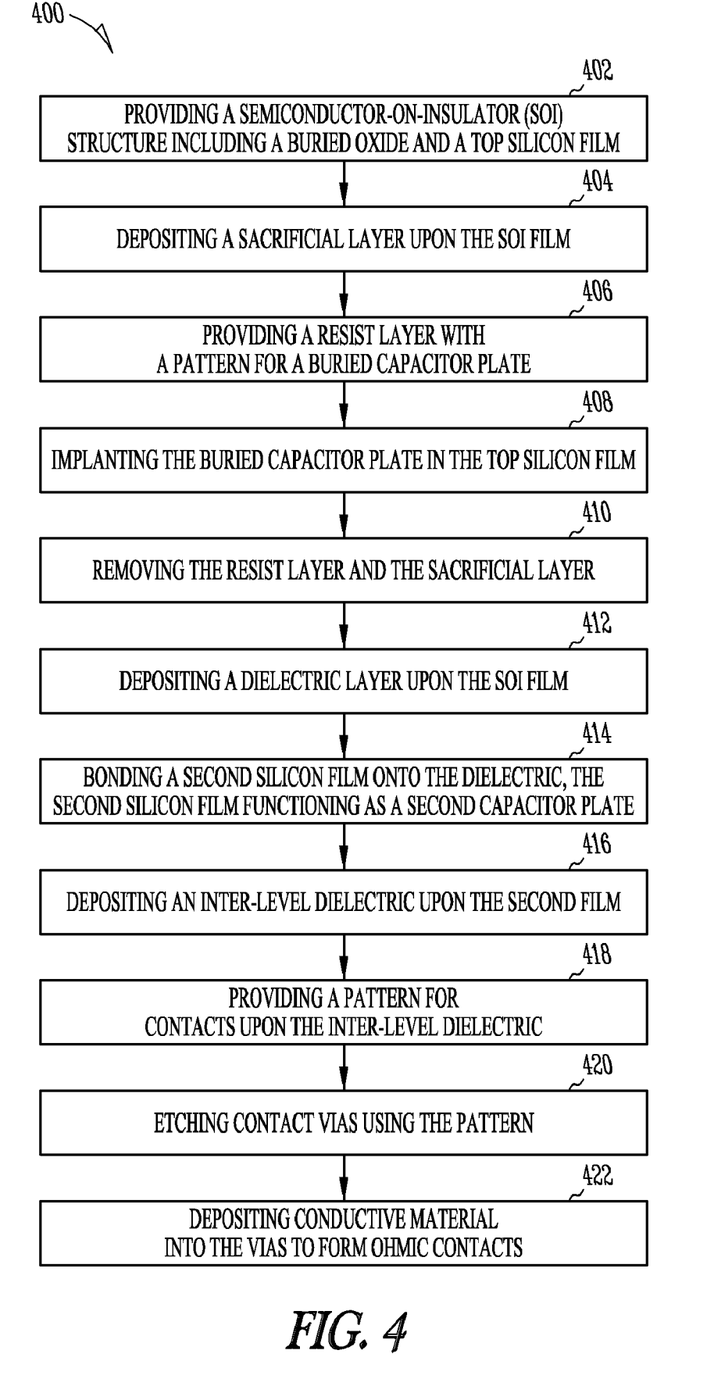
FIG. 4 illustrates a flow diagram of a method for fabricating a buried decoupling capacitor apparatus, according to an embodiment.

FIG. 4 illustrates a flow diagram of a method 400 for fabricating a buried decoupling capacitor apparatus, according to an embodiment. The depicted method embodiment includes providing a semiconductor-on-insulator (SOI) structure including a buried oxide and a top silicon film, at 402, and depositing a sacrificial layer upon the SOI film, at 404. The method embodiment also includes providing a resist layer with a pattern for a buried capacitor plate, at 406, and implanting the buried capacitor plate in the top silicon film, at 408. The method embodiment further includes removing the resist layer and the sacrificial layer, at 410, and depositing a dielectric layer upon the SOI film, at 412. The method embodiment may further include bonding a second silicon film onto the dielectric, the second silicon film functioning as a second capacitor plate, at 414, and depositing an inter-level dielectric upon the second film, at 416. The method embodiment may also include providing a pattern for contacts upon the inter-level dielectric, at 418, etching contact vias using the pattern, at 420, and depositing conductive material into the vias to form ohmic contacts, at 422.

According to various embodiments, implanting the buried capacitor plate includes implanting boron, arsenic, or phosphorus. Other types of implants may be used without departing from the scope of this disclosure. Depositing a dielectric layer (step 412) includes depositing silicon dioxide or a high-k dielectric material, in various embodiments. Etching contact vias includes etching down to the buried capacitor plate, in an embodiment. In another embodiment, etching contact vias includes etching down to the buried capacitor plate and to a support wafer at ground. Depositing an inter-level dielectric layer (step 416) includes depositing silicon dioxide, or a material having a lower dielectric constant than silicon dioxide, in varying embodiments.

In the remaining figures, circuit modules will be described as they are used in a variety of applications. According to the teachings of the present disclosure, the modules described may include various embodiments of the disclosed buried decoupling capacitor apparatus and methods.

Figure 5:
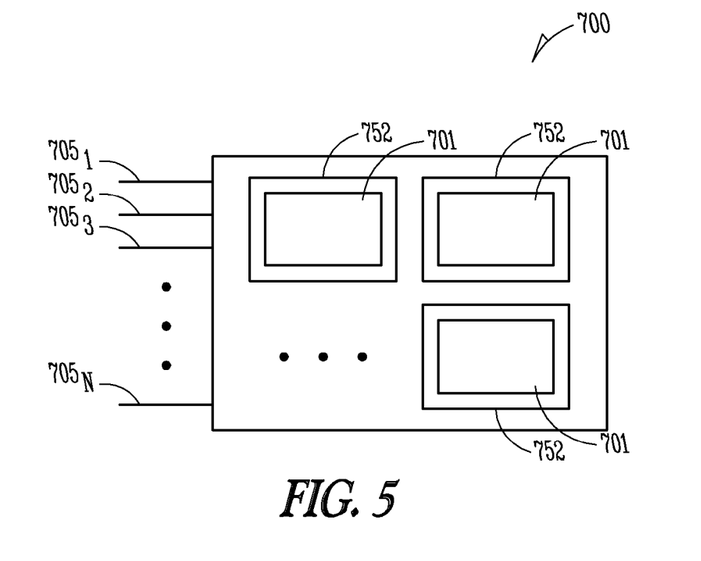
FIG. 5 illustrates a block diagram of a circuit module, according to an embodiment.

As shown in FIG. 5, two or more dies 701 may be combined, with or without protective casing, into a circuit module 700 to enhance or extend the functionality of an individual die 701. Circuit module 700 may be a combination of dies 701 representing a variety of functions, or a combination of dies 701 containing the same functionality. In one embodiment, circuit module 700 includes at least one socket, slot, recess or the like 752 into which the die 701 is received. Slot 752, in one embodiment, is a circuit board 750. Slot 752, in another embodiment, represents a mount including land patterns. In any embodiment, dies 701 may be received by slot 752 in a pick-and-place operation by suitable pick-and-place machines.

Some examples of a circuit module 700 include memory modules, device drivers, power modules, communication modems, processor modules and application-specific modules, and may include multilayer, multi-chip modules. Such modules will have a chip receiver in which a chip according to the present disclosure is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module according to the present disclosure is inserted. Circuit module 700 will have a variety of leads 705$_1$ through 705$_N$ extending therefrom providing unilateral or bilateral communication and control in its particular application.

Figure 6:
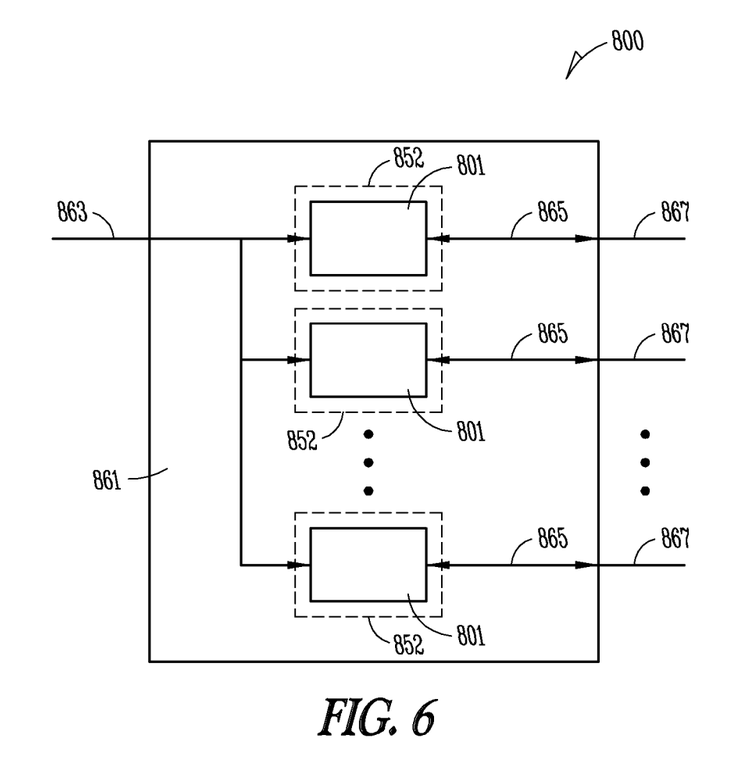
FIG. 6 illustrates a block diagram of a memory module, according to an embodiment.

FIG. 6 shows one embodiment of a circuit module as memory module 800. Memory module 800 contains multiple memory devices 801 contained on support 861. Representative memory devices include volatile and non-volatile memory, such as DRAM, SRAM, SDRAM, EEPROM, flash memory, ROM, etc. In one embodiment, support 861 includes slots 852 for receiving memory devices 801. The number of memory devices generally depends upon the desired bus width and the desire for parity. Memory devices 801 include at least one die having a buried decoupling capacitor in accordance with the present disclosure. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 861. Leads 867 are shown for conceptual purposes and are not limited to the position shown.

Figure 7:
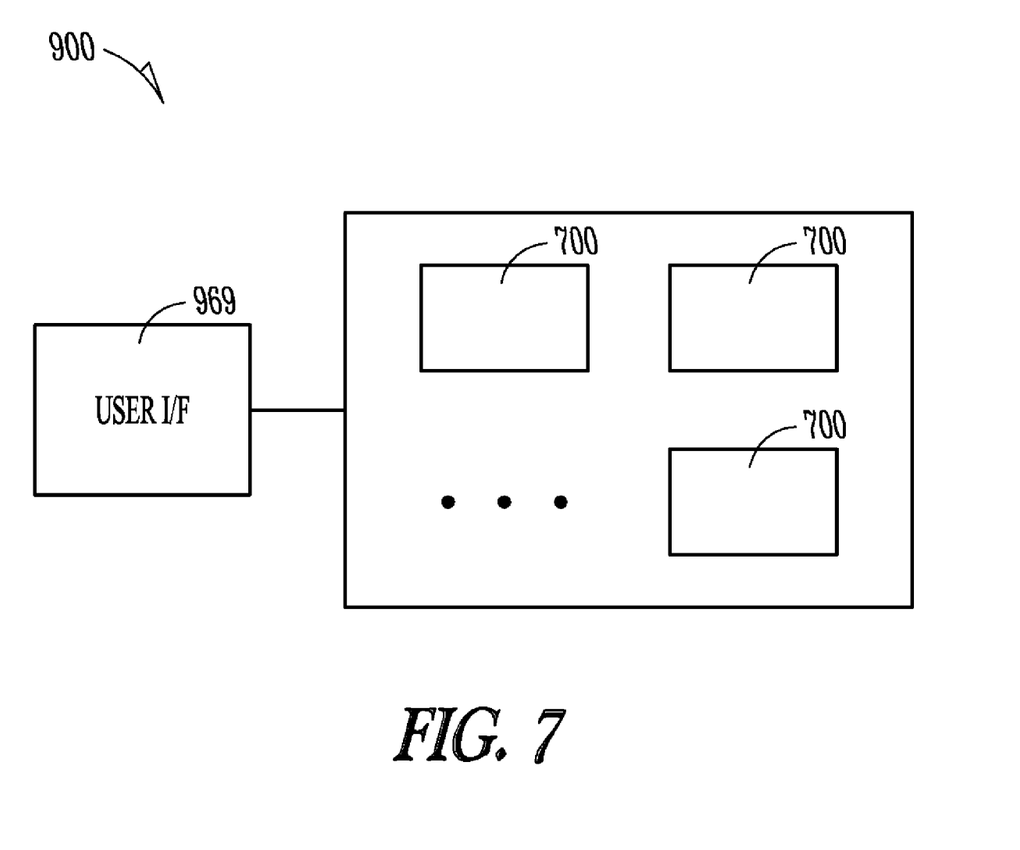
FIG. 7 illustrates a block diagram of an electronic system, according to an embodiment.

FIG. 7 shows one embodiment of an electronic system 900 containing one or more circuit modules 700. Electronic system 900 generally contains a user interface 969. User interface 969 provides a user of the electronic system 900 with some form of control or observation of the results of the electronic system 900. Some examples of user interface 969 include: the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provide to, electronic system 900. In another embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that one or more circuit modules 700 in electronic system 900 may be replaced by a single integrated circuit. Furthermore, electronic system 900 may be a subcomponent of a larger electronic system.

Figure 8:
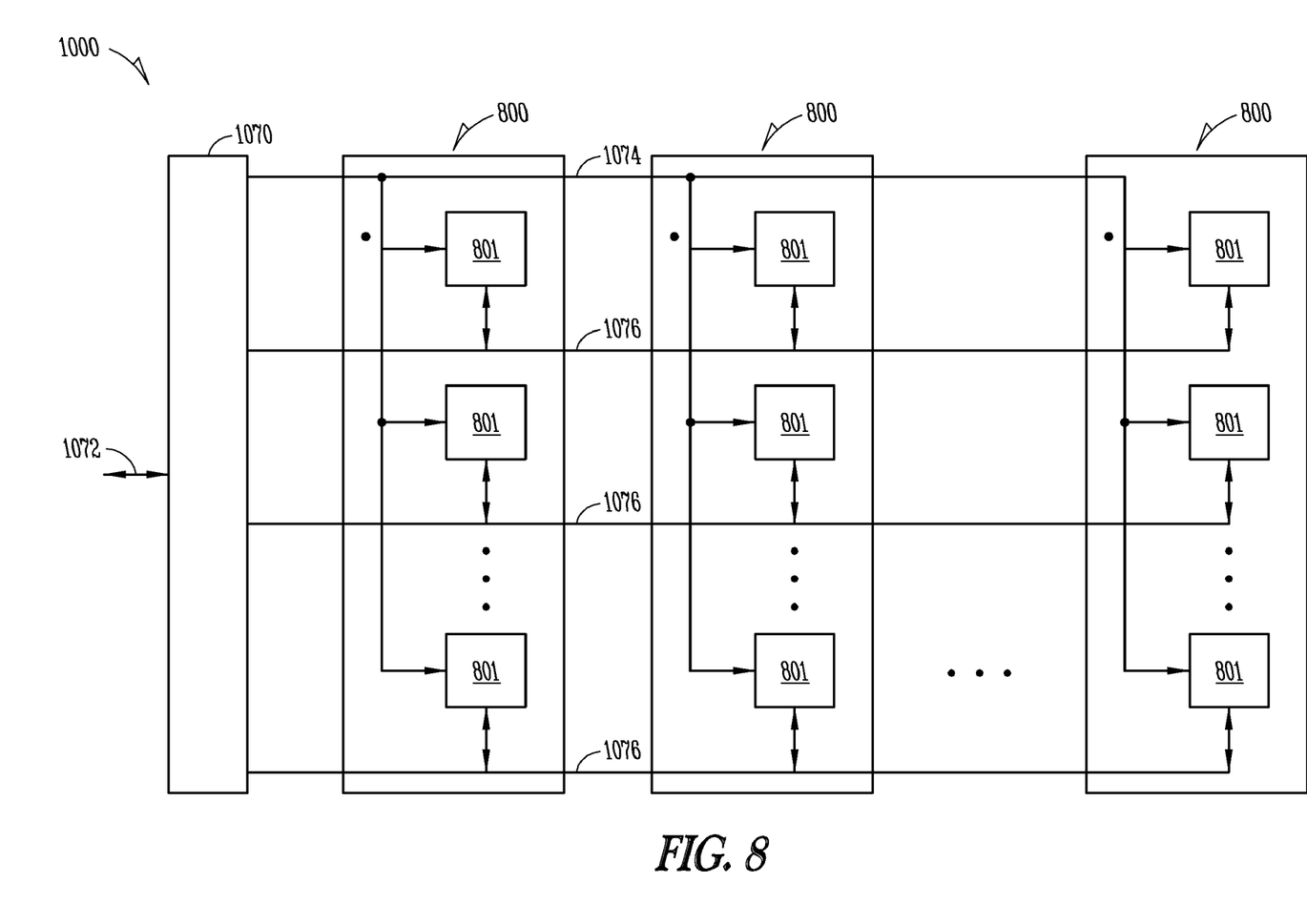
FIG. 8 illustrates a block diagram of a memory system, according to an embodiment.

FIG. 8 shows one embodiment of an electronic system as memory system 1000. Memory system 1000 contains one or more memory modules 800 and a memory controller 1070. At least one of the memory modules 800 includes a buried coupling capacitor in accordance with the present disclosure. Memory controller 1070 provides and controls a bidirectional interface between memory system 1000 and an external system bus 1072. Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 9:
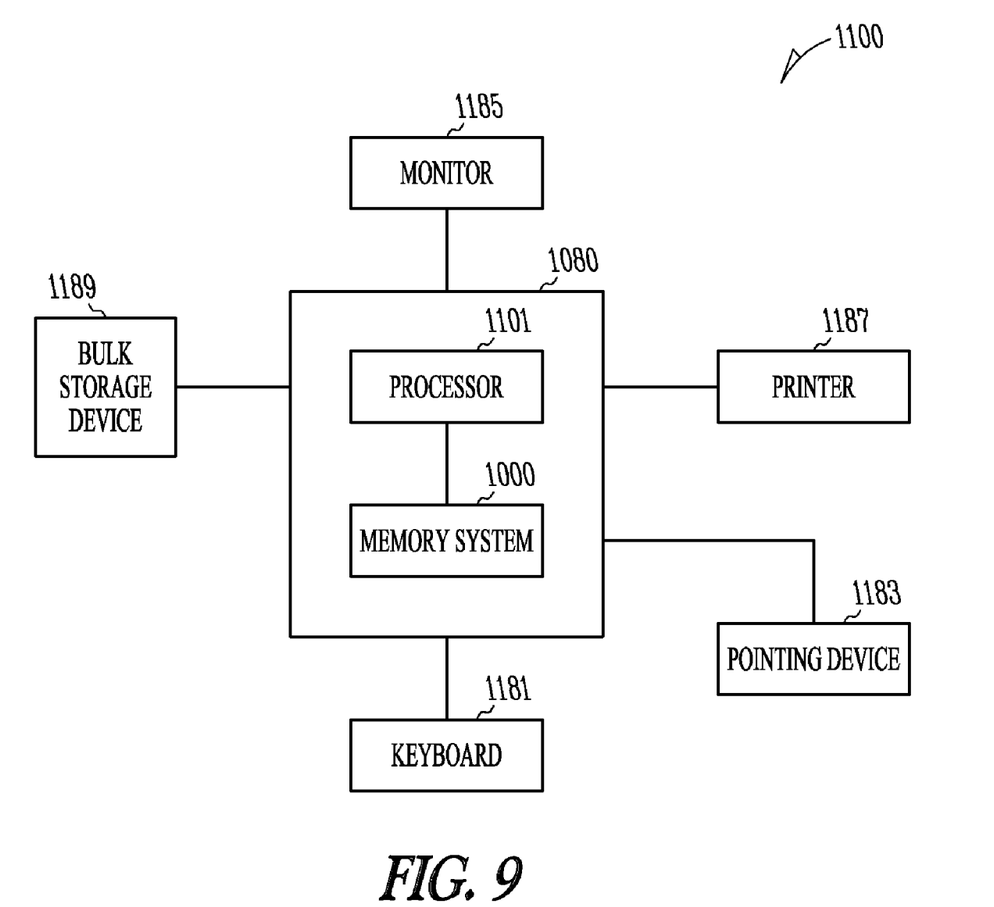
FIG. 9 illustrates a block diagram of a computer system, according to an embodiment.

FIG. 9 shows a further embodiment of an electronic system as a computer system 1100. Computer system 1100 contains a processor 1101 and a memory system 1000 housed in a computer unit 1080. Computer system 1100 is but one example of an electronic system containing another electronic system, i.e., memory system 1000, as a subcomponent. Computer system 1100 optionally contains interface components. Depicted in FIG. 9 are a keyboard 1181, a pointing device 1183 such as a mouse, trackball or joystick, a monitor 1185, a printer 1187 and a bulk storage device 1189. It will be appreciated that other components are often associated with computer system 1100 such as modems, device drivers, additional storage devices, etc. It will be appreciated that the processor 1101 and memory system 1000 of computer system 1100 may be incorporated on a single integrated circuit. Such single package processing units reduce the communication time between the processor and the memory circuit.

One of ordinary skill in the art will understand that, the modules and other circuitry shown and described herein may be implemented using software, hardware, and combinations of software and hardware. As such, the illustrated modules and circuitry are intended to encompass software implementations, hardware implementations, and software and hardware implementations.

The methods illustrated in this disclosure are not intended to be exclusive of other methods within the scope of the present subject matter. Those of ordinary skill in the art will understand, upon reading and comprehending this disclosure, other methods within the scope of the present subject matter. The above-identified embodiments, and portions of the illustrated embodiments, are not necessarily mutually exclusive. These embodiments, or portions thereof, may be combined. In various embodiments, the methods provided above are implemented as a computer data signal embodied in a carrier wave or propagated signal, that represents a sequence of instructions which, when executed by a processor cause the processor to perform the respective method. In various embodiments, methods provided above are implemented as a set of instructions contained on a computer-accessible medium capable of directing a processor to perform the respective method. In various embodiments, the medium is a magnetic medium, an electronic medium, or an optical medium.

Although specific embodiments have been illustrated and described herein, it will be appreciated by those of ordinary skill in the art that any arrangement which is calculated to achieve the same purpose may be substituted for the specific embodiment shown. This application is intended to cover adaptations or variations of the present subject matter. It is to be understood that the above description is intended to be illustrative, and not restrictive. Combinations of the above embodiments as well as combinations of portions of the above embodiments in other embodiments will be apparent to those of skill in the art upon reviewing the above description.

The scope of the present subject matter should be determined with reference to the appended claims, along with the full scope of equivalents to which such claims are entitled.

What is claimed is:

1. A method, comprising:
doping a region within a semiconductor-on-insulator substrate to form a first capacitor plate;
depositing a layer of dielectric material on the first capacitor plate; and
bonding a doped film upon the dielectric to form a source/drain region of a transistor and further to form a second capacitor plate.

2. The method of claim 1, wherein doping a region within the substrate includes doping a region within a semiconductor portion of the substrate.

3. The method of claim 2, further comprising:
depositing an inter-level dielectric upon the second plate.

4. The method of claim 3, further comprising:
providing a pattern for contacts upon the inter-level dielectric.

5. The method of claim 4, further comprising:
etching contact vias using the pattern.

6. The method of claim 5, further comprising:
depositing conductive material into the vias to form ohmic contacts.

7. The method of claim 6, further comprising:
depositing a contact fill material around the contacts.

8. The method of claim 7, further comprising:
performing back end of line (BEOL) processing on the contacts.

9. A method, comprising:
doping a region within a top silicon region of a silicon-on-insulator substrate, the substrate including a buried insulator region and the top silicon region on the buried insulator region, to form a first capacitor plate;
depositing a layer of dielectric material on the first capacitor plate; and
bonding a doped film upon the dielectric to form a source/drain region of a transistor and further to form a second capacitor plate.

10. The method of claim 9, wherein depositing a layer of dielectric material includes depositing a high-k dielectric material.

11. The method of claim 9, wherein bonding a doped film upon the dielectric to form a source/drain region of a transistor includes patterning source/drain regions for the transistor.

12. The method of claim 11, wherein patterning source/drain regions for a transistor includes patterning regions for an NMOS transistor.

13. The method of claim 11, wherein patterning source/drain regions for a transistor includes patterning regions for a PMOS transistor.

14. The method of claim 9, wherein forming the first capacitor plate, the dielectric material and the second capacitor plate include forming a decoupling capacitor.

15. The method of claim 14, wherein forming the decoupling capacitor includes forming the decoupling capacitor as part of an integrated circuit.

16. The method of claim 14, wherein forming the decoupling capacitor includes forming the decoupling capacitor as part of a memory circuit.

17. A method, comprising:
providing a semiconductor-on-insulator (SOI) structure including a buried oxide and a top silicon film;
depositing a sacrificial layer upon the top silicon film;
providing a resist layer with a pattern for a buried capacitor plate;
implanting the buried capacitor plate in the top silicon film;
removing the resist layer and the sacrificial layer;
depositing a dielectric layer upon the top silicon film;
bonding a second silicon film onto the dielectric, the second silicon film functioning as a second capacitor plate;
depositing an inter-level dielectric upon the second film;
providing a pattern for contacts upon the inter-level dielectric;
etching contact vias using the pattern; and
depositing conductive material into the vias to form ohmic contacts.

18. The method of claim 17, wherein implanting the buried capacitor plate includes implanting boron, arsenic or phosphorus.

19. The method of claim 17, wherein depositing a dielectric layer upon the top silicon film includes depositing silicon dioxide or a high-k dielectric material.

20. The method of claim 17, wherein etching contact vias includes etching down to the buried capacitor plate.

21. The method of claim 17, wherein etching contact vias includes etching down to the buried capacitor plate and to a support wafer at ground.

* * * * *